(12) United States Patent
Nemoto et al.

(10) Patent No.: US 10,783,034 B2
(45) Date of Patent: Sep. 22, 2020

(54) MEMORY SYSTEM AND CONTROL METHOD

(71) Applicant: Toshiba Memory Corporation, Minato-ku (JP)

(72) Inventors: Hiroyuki Nemoto, Nishitokyo (JP); Chihoko Shigeta, Kunitachi (JP); Kazuya Kitsunai, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 61 days.

(21) Appl. No.: 16/124,981

(22) Filed: Sep. 7, 2018

(65) Prior Publication Data

US 2019/0196905 A1 Jun. 27, 2019

(30) Foreign Application Priority Data

Dec. 22, 2017 (JP) ................. 2017-246674

(51) Int. Cl.
| | |
|---|---|
| *G06F 11/10* | (2006.01) |
| *G06F 3/06* | (2006.01) |
| *G11C 29/00* | (2006.01) |
| *G11C 5/14* | (2006.01) |
| *G11C 29/52* | (2006.01) |
| *G11C 29/04* | (2006.01) |

(52) U.S. Cl.
CPC ........ *G06F 11/1068* (2013.01); *G06F 3/0619* (2013.01); *G06F 3/0659* (2013.01); *G06F 3/0679* (2013.01); *G06F 11/1048* (2013.01); *G11C 5/143* (2013.01); *G11C 29/76* (2013.01); *G11C 29/52* (2013.01); *G11C 29/70* (2013.01); *G11C 2029/0411* (2013.01)

(58) Field of Classification Search
CPC ............ G06F 11/1048; G06F 11/1068; G06F 3/0619; G06F 3/06; G06F 3/0659; G06F 3/0679; G06F 3/0647; G11C 5/141; G11C 5/143; G11C 29/76
See application file for complete search history.

(56) References Cited

U.S. PATENT DOCUMENTS

| | | |
|---|---|---|
| 2008/0270680 A1 | 10/2008 | Chang |
| 2012/0166906 A1 | 6/2012 | Nagadomi et al. |

(Continued)

FOREIGN PATENT DOCUMENTS

| | | |
|---|---|---|
| JP | 2012-137994 | 7/2012 |

*Primary Examiner* — Shelly A Chase
(74) *Attorney, Agent, or Firm* — Oblon, McClelland, Maier & Neustadt, L.L.P.

(57) ABSTRACT

According to one embodiment, in a memory system, a controller is configured to write a first data among write data to be written across the multiple chips of the first memory area into part of the first memory area and write, in response to a power supply disconnection being detected before writing a second data among the write data into the first memory area, a first information about a storage location where the second data has been stored and the second data into the second memory area. The controller is configured to read, in response to power return being detected, the first data from the part of the first memory area, and read the first information from the second memory area. The controller is configured to generate a second information about a reference location to access the second data based on the read first information.

20 Claims, 13 Drawing Sheets

(56) References Cited

U.S. PATENT DOCUMENTS

| | | | | |
|---|---|---|---|---|
| 2013/0039141 A1* | 2/2013 | Smith | ............... | G11C 5/141 |
| | | | | 365/228 |
| 2013/0067146 A1 | 3/2013 | Zettsu | | |
| 2013/0229870 A1* | 9/2013 | Kajigaya | ............ | G11C 14/00 |
| | | | | 365/185.08 |
| 2014/0082406 A1* | 3/2014 | Erez | ............... | G06F 11/1441 |
| | | | | 714/2 |
| 2014/0379972 A1 | 12/2014 | Zettsu | | |
| 2015/0074451 A1 | 3/2015 | Yoshida et al. | | |
| 2015/0324283 A1* | 11/2015 | Lai | ..................... | G06F 3/06 |
| | | | | 714/764 |
| 2016/0253112 A1* | 9/2016 | Chen | ............... | G06F 3/0647 |
| | | | | 714/6.21 |
| 2017/0070241 A1 | 3/2017 | Kaku et al. | | |

\* cited by examiner

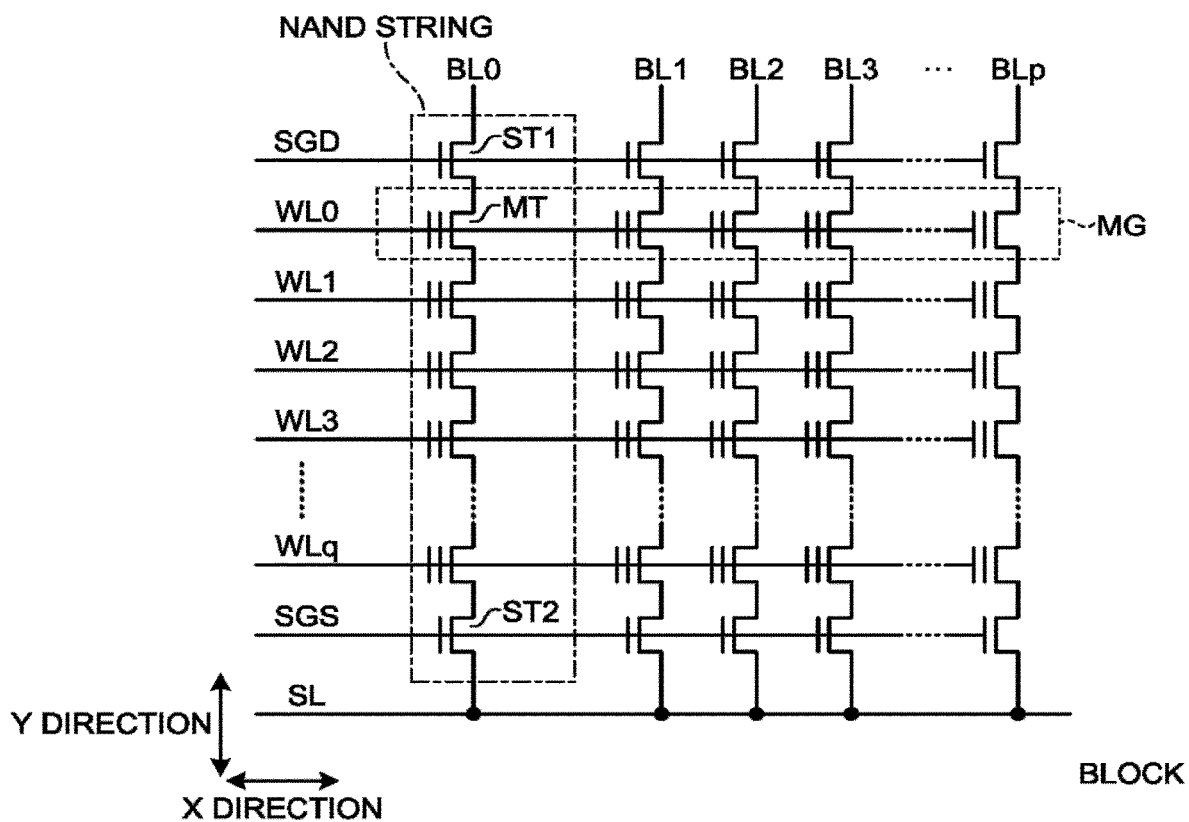

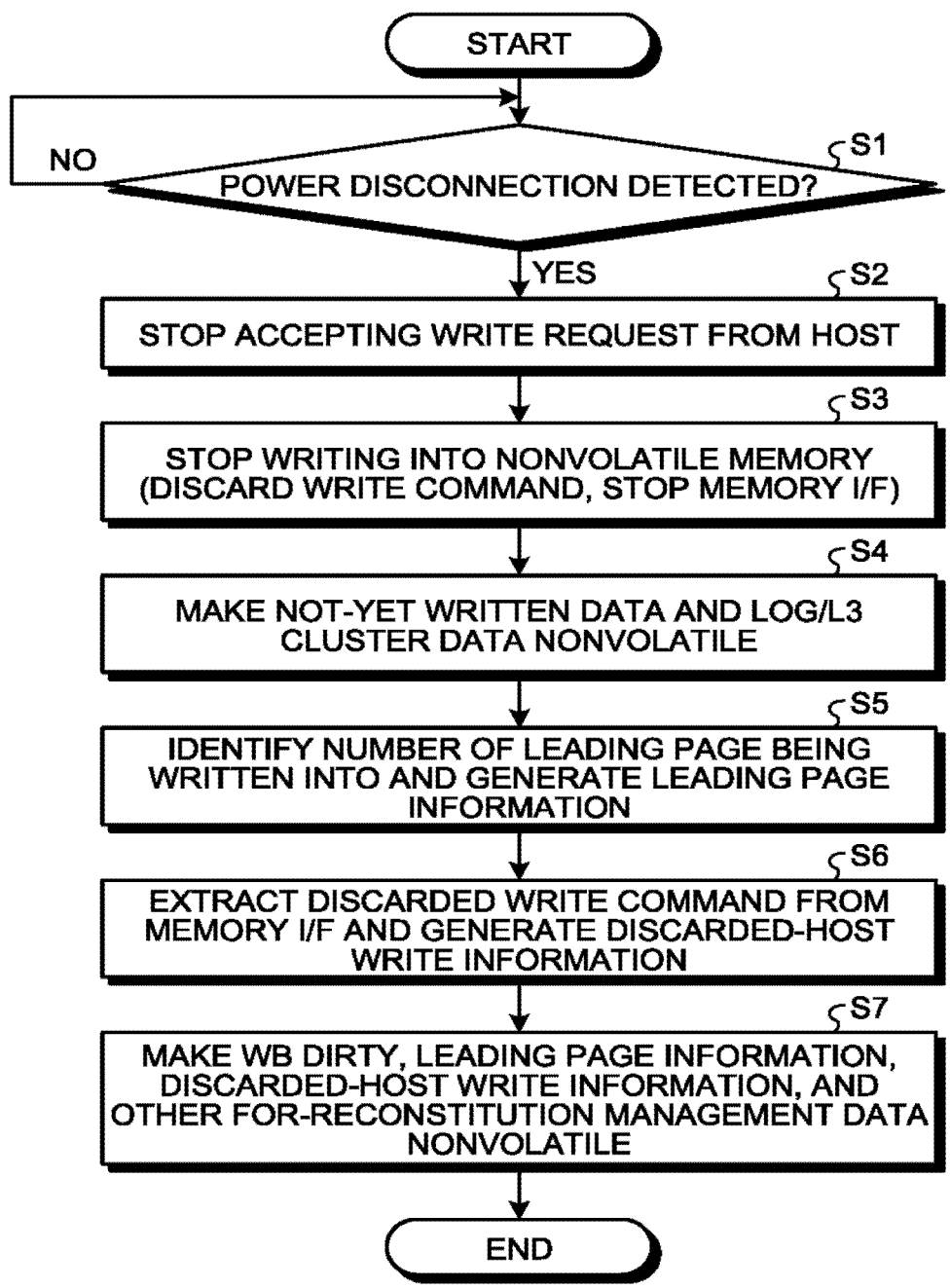

FIG.6A

| BLO/PG-(N+1)/CH3/BK1 | | ← 22e |
|---|---|---|
| VADD-35 | Data | |

FIG.6B

| BLO/PG-(N+3)/CH0/BK0 | | ← 22e |
|---|---|---|
| | Null | |

FIG.6C

| BLO/PG-(N+3)/CH7/BK1 | | ← 22e |
|---|---|---|
| VADD-46 | Log | |

FIG.6D

| BLO/PG-(N+2)/CH14/BK1 | | ← 22e |
|---|---|---|
| VADD-62 | L3 | |

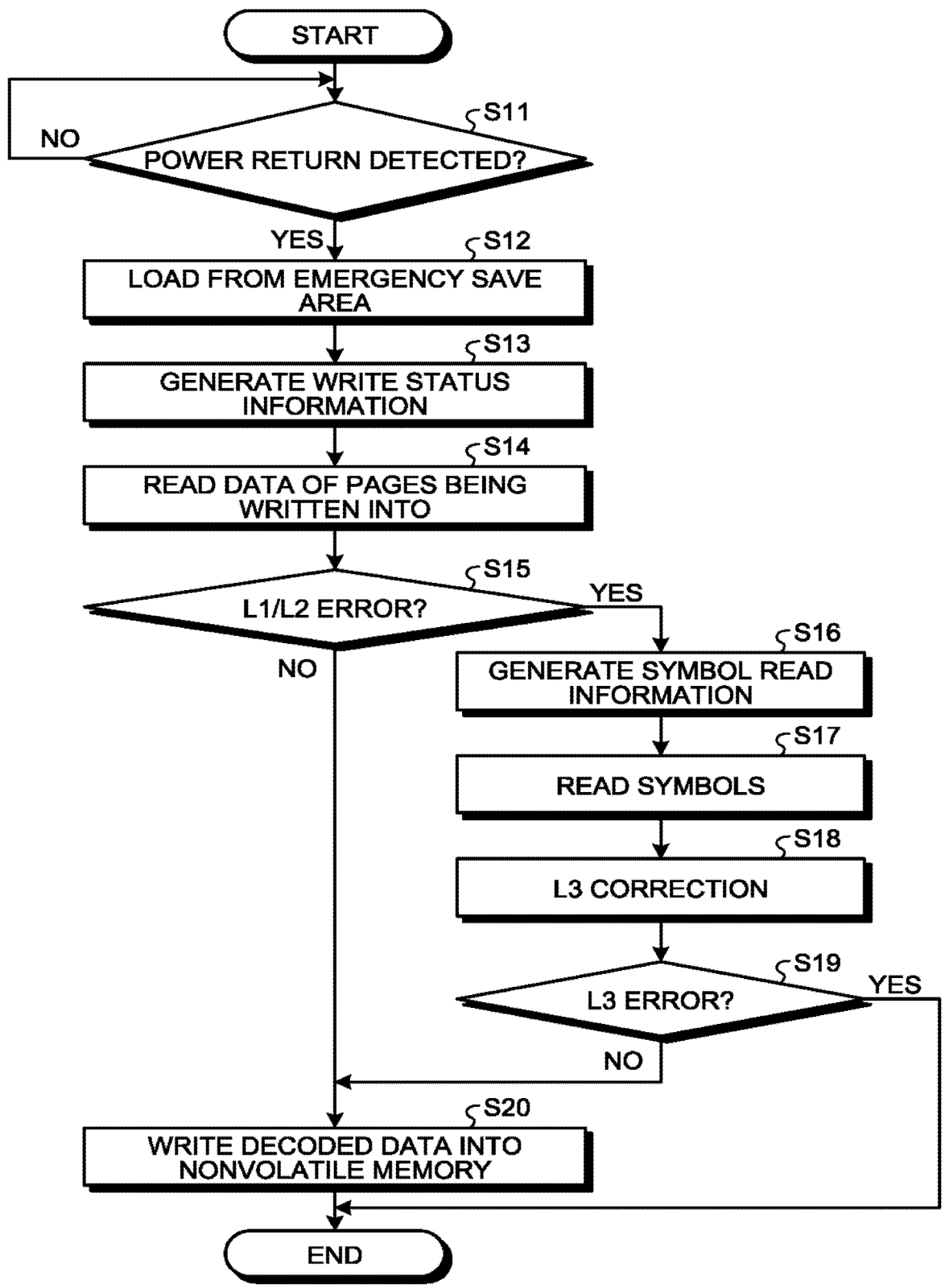

FIG.9

| LOGICAL ADDRESS (LBA) | PHYSICAL ADDRESS (LOGICAL BLOCK NUMBER + LOGICAL PAGE NUMBER + SLOT NUMBER) | VALID/ INVALID |
|---|---|---|
| LBA0 | NVADD-0(BL0, P6-(N+2), SL0) | 1 |
| LBA1 | NVADD-1(BL0, P6-(N+2), SL1) | 1 |
| ⋮ | ⋮ | ⋮ |
| LBA34 | NVADD-34(BL0, P6-(N+2), SL18) | 1 |
| LBA35 | NVADD-35(BL0, P6-(N+2), SL19) | 0 |
| ⋮ | ⋮ | ⋮ |
| LBA62 | NVADD-62(BL0, P6-(N+2), SL30) | 0 |
| LBA63 | NVADD-63(BL0, P6-(N+2), SL31) | 0 |
| ⋮ | ⋮ | ⋮ |

FIG.10

| L3 NUMBER | LOCATION INFORMATION |
|---|---|
| 0 | NVADD-0 |
| 1 | NVADD-1 |
| ⋮ | ⋮ |
| 34 | NVADD-34 |
| 35 | VADD-35 |
| ⋮ | ⋮ |
| 39 | (ALL FF) |
| ⋮ | ⋮ |
| 46 | VADD-46 |
| ⋮ | ⋮ |
| 62 | VADD-62 |
| 63 | VADD-63 |

FIG.11

| LOGICAL BLOCK NUMBER | LOGICAL PAGE NUMBER | DEFECT INFORMATION | | | ERROR INFORMATION | USED/ UNUSED | "INVALID" FLAG |
|---|---|---|---|---|---|---|---|
| | | DEFECT FLAG | DEFECTIVE-SLOT NUMBER | NUMBER OF DEFECTIVE MEMORY CHIPS | | | |
| ... | ... | ... | ... | | ... | ... | ... |
| BL0 | PG-(N+2) | PRESENT | SL29, SL31 | 2 | PRESENT | USED | ABSENT |
| ... | ... | ... | ... | | ... | ... | ... |

22d

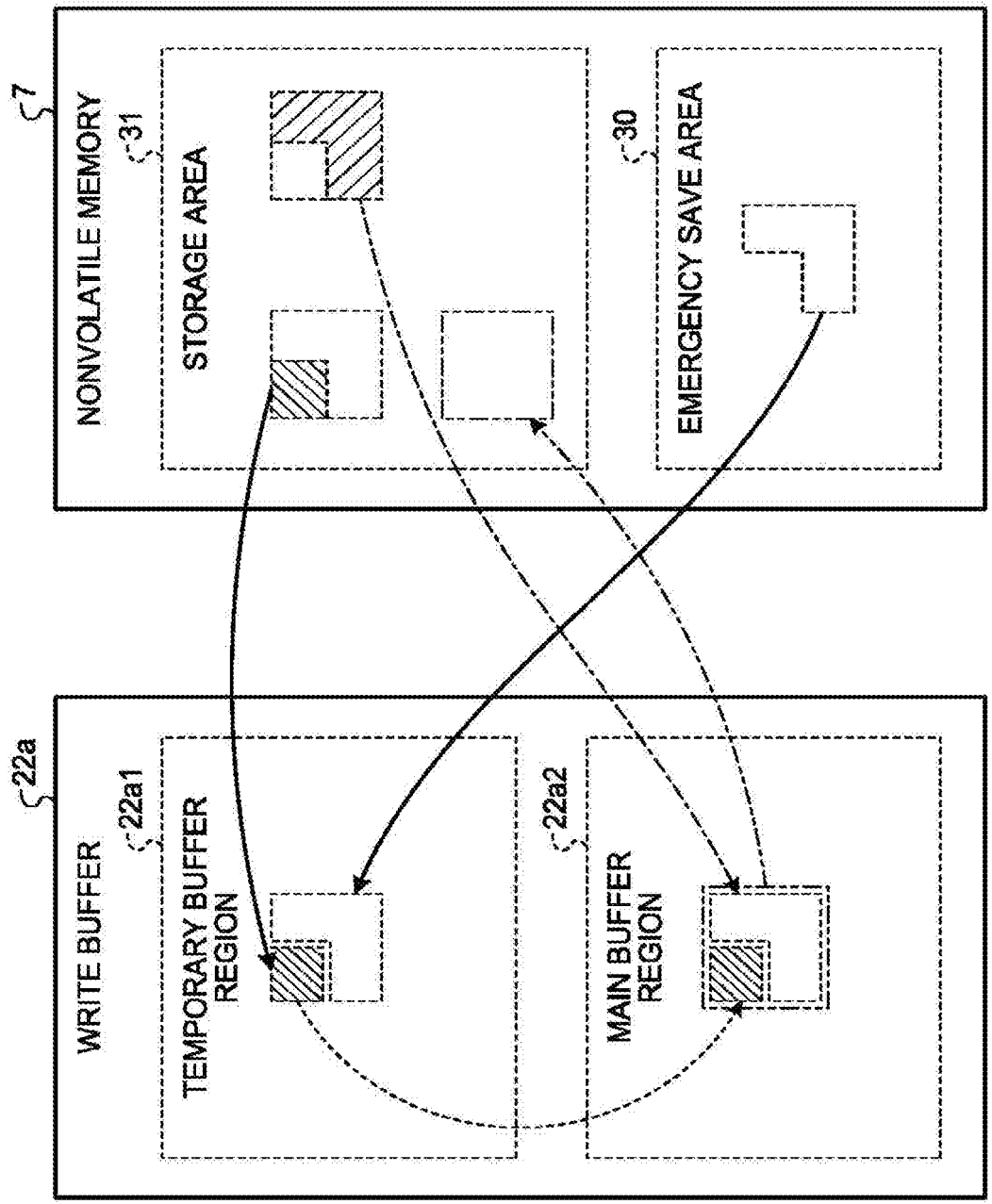

MEMORY SYSTEM AND CONTROL METHOD

CROSS-REFERENCE TO RELATED APPLICATIONS

This application is based upon and claims the benefit of priority from Japanese Patent Application No. 2017-246674, filed on Dec. 22, 2017; the entire contents of which are incorporated herein by reference.

FIELD

Embodiments described herein relate generally to a memory system and a control method.

BACKGROUND

In a memory system such as a solid state drive (SSD), data corresponding to a write request together with an error correction code for the data are stored into a nonvolatile memory, thereafter in response to a read request, the data and the error correction code are read from the nonvolatile memory, and the data are reconstituted by error-correction decoding using the error correction code. At this time, it is desired to reconstitute the data appropriately.

BRIEF DESCRIPTION OF THE DRAWINGS

FIG. 4 is a diagram illustrating a configuration of a physical block in the embodiment;

FIG. 5 is a flow chart illustrating an operation of the memory system at a time of power supply disconnection according to the embodiment;

FIGS. 6A to 6D are diagrams illustrating a data structure of discarded-host write information in the embodiment;

FIG. 7 is a flow chart illustrating an operation of the memory system at a time of power return according to the embodiment;

FIG. 9 is a diagram illustrating address conversion information logical-physical conversion table) in the embodiment;

FIG. 10 is a diagram illustrating symbol read information (a symbol read table) in the embodiment;

FIG. 11 is a diagram illustrating block management information (a logical block management table) in a modified example of the embodiment;

FIG. 14 is a diagram illustrating a fill-in-the-blank read process in another modified example of the embodiment.

DETAILED DESCRIPTION

In general, according to one embodiment, there is provided a memory system including a nonvolatile memory and a controller. The nonvolatile memory has a first memory area including multiple chips and a second memory area. The controller is configured to write a first data among write data to be written across the multiple chips of the first memory area into part of the first memory area and write, in response to a power supply disconnection being detected before writing a second data among the write data into the first memory area, a first information about a storage location where the second data has been stored and the second data into the second memory area. The controller is configured to read, in response to power return being detected, the first data from the part of the first memory area, and read the first information from the second memory area. The controller is configured to generate a second information about a reference location to access the second data based on the read first information. The controller is configured to read the second data from the second memory area to store the read second data based on the generated second information. The controller is configured to write the read first data and the stored second data into another part of the first memory area.

Exemplary embodiments of a memory system will be explained below in detail with reference to the accompanying drawings. The present invention is not limited to the following embodiments.

EMBODIMENT

Figure 1:
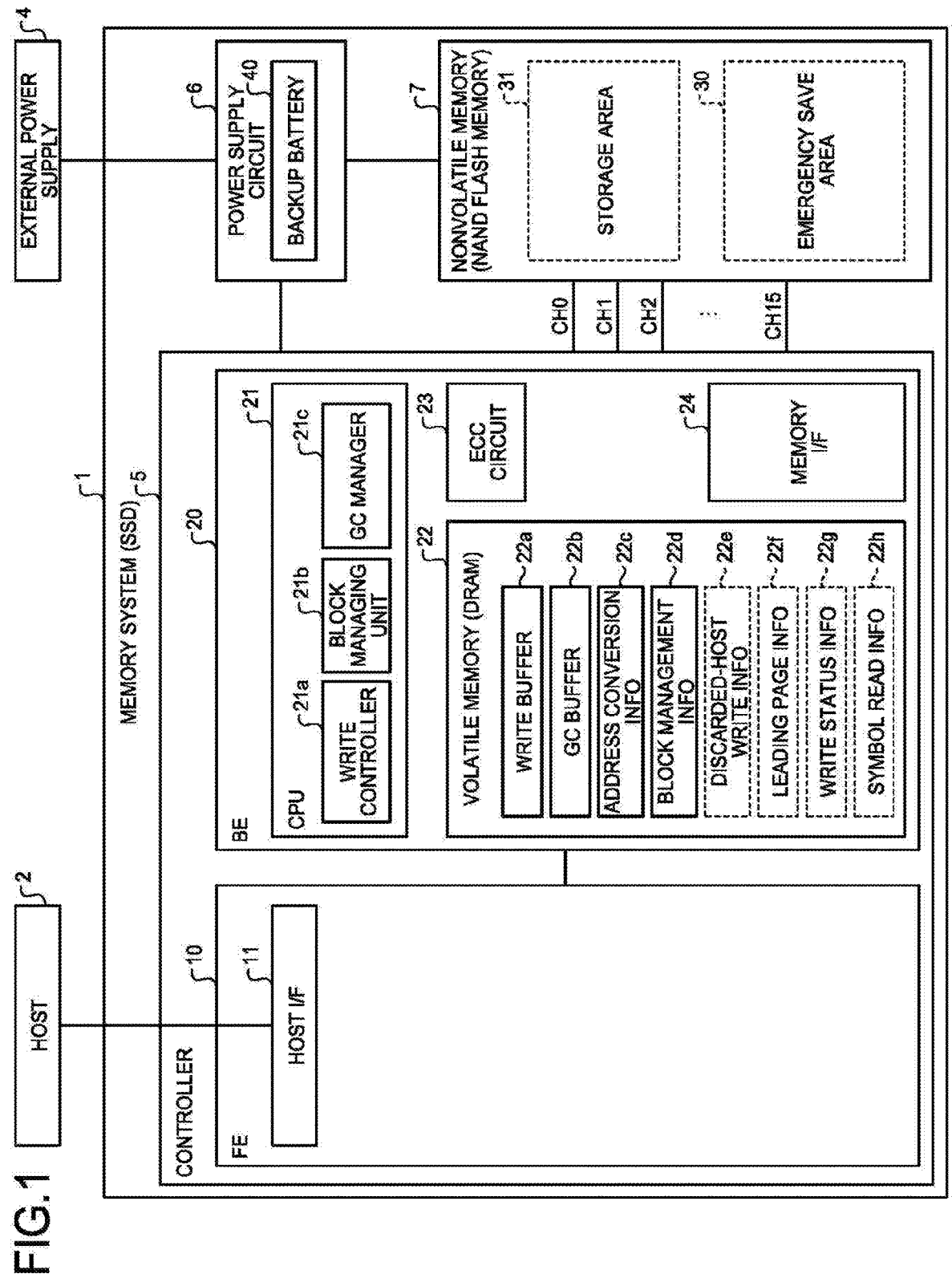
FIG. 1 is a diagram illustrating a configuration of a memory system according to an embodiment.

In a memory system such as a solid state drive (SSD), data corresponding to a write request together with an error correction code for the data are stored into a nonvolatile memory, thereafter in response to a read request, the data and the error correction code are read from the nonvolatile memory, and the data are reconstituted by error-correction decoding using the error correction code. For example, a memory system 1 is configured as shown in FIG. 1. FIG. 1 is a diagram illustrating a configuration of the memory system 1.

The memory system 1 is connected externally to a host 2 via a communication medium and functions as an external storage medium for the host 2 The host 2 includes, for example, a personal computer or a CPU core. The memory system 1 includes, for example, a solid state drive (SSD). The memory system 1 includes a controller a, a power supply circuit 6, and a nonvolatile memory 7. The controller 5 includes a front end circuit (FE) 10 and a back end circuit (BE) 20. The FE 10 includes a host interface (host I/F) 11. The BE 20 includes a central processing unit (CPU) 21, a volatile memory 22, an error correction (FCC) circuit 23, and a memory interface (memory I/F) 24. The power supply circuit 6 is connected to an external power supply 4 and includes a backup battery 40. The memory I/F 24 and the nonvolatile memory 7 are connected via multiple channels (e.g., 16 channels CH0 to CH15 in the case of FIG. 1).

The memory system 1 stores data in a nonvolatile manner using the nonvolatile memory 7. The nonvolatile memory 7 includes a NAND flash memory, a three-dimensionally structured flash memory, a resistive random access memory (ReRAM), a ferroelectric random access memory (FeRAM), a phase change memory (PCM), a magnetoresistive random access memory (PRAM), or the like. FIG. 1 illustrates a case where the nonvolatile memory 7 is a NAND flash memory.

The nonvolatile memory 7 has multiple logical blocks. Some of the multiple logical blocks are assigned as an emergency save area 30, and the remaining (most) logical blocks are assigned as a storage area 31. Each logical block includes multiple logical pages. The storage area 31 is an area to store data which the host 2 made a request to write and management data in the memory system 1, and the emergency save area 30 is an area in which to save data to be saved when a disconnection of power supply to the power supply circuit 6 occurs.

Figure 2:
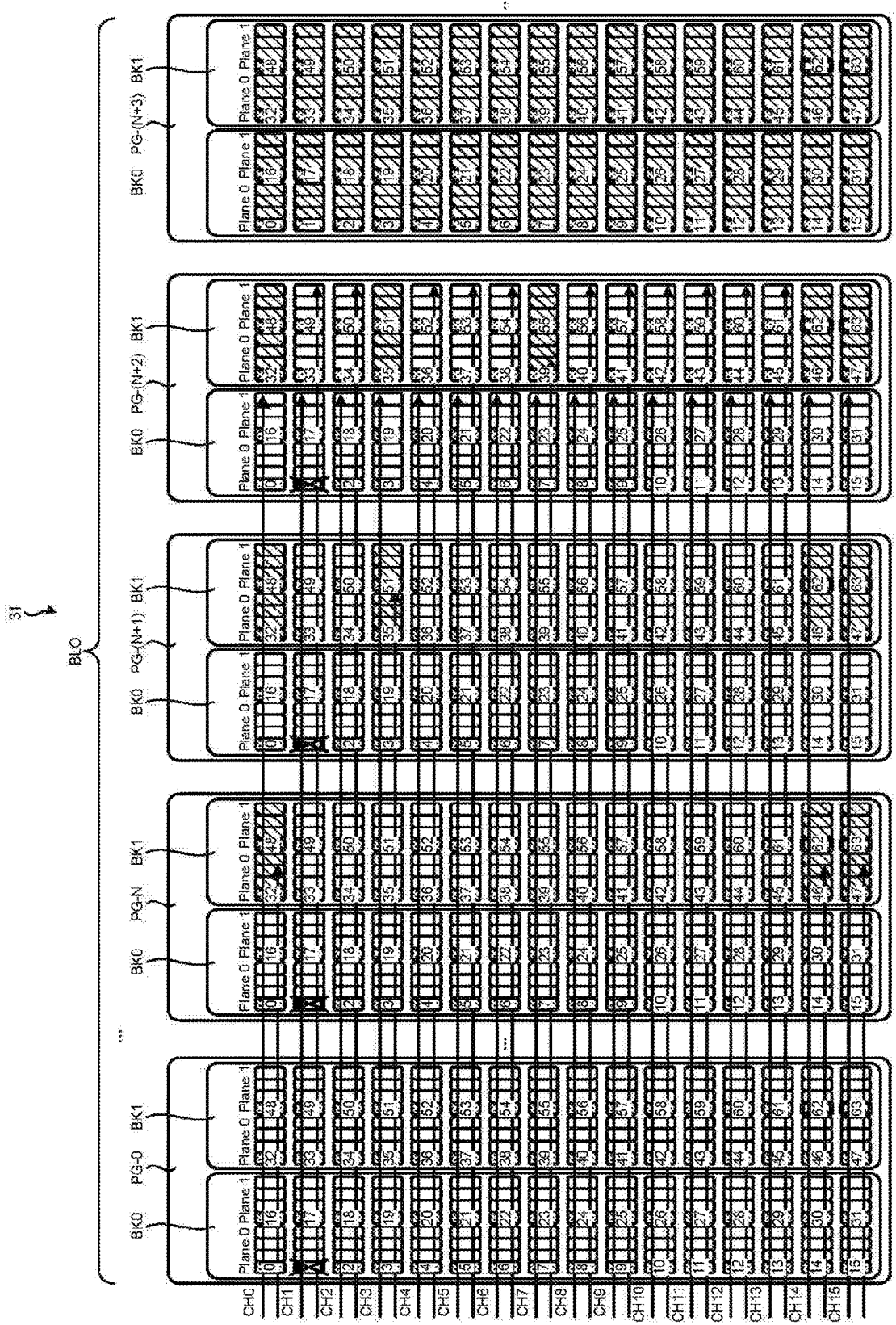
FIG. 2 is a diagram illustrating a configuration of a logical block in the embodiment.

For example, a logical block BL0 includes multiple logical pages PG-0 to PG-(N+3) (when logical pages are not distinguished, they are referred to as PG) as shown in FIG. 2. FIG. 2 is a diagram illustrating a configuration of the logical block BL0. N denotes any integer greater than or equal to one. Each logical page PG includes multiple banks for which bank interleaving is possible. In FIG. 2, for each channel CH0 to CH15, two arrows indicate that bank interleaving across two banks BK0, BK1 is possible. The tip of each arrow indicates the degree of progress of processing by bank interleaving. Each bank includes multiple memory chips. Each memory chip can include multiple planes accessible in parallel.

Figure 3:
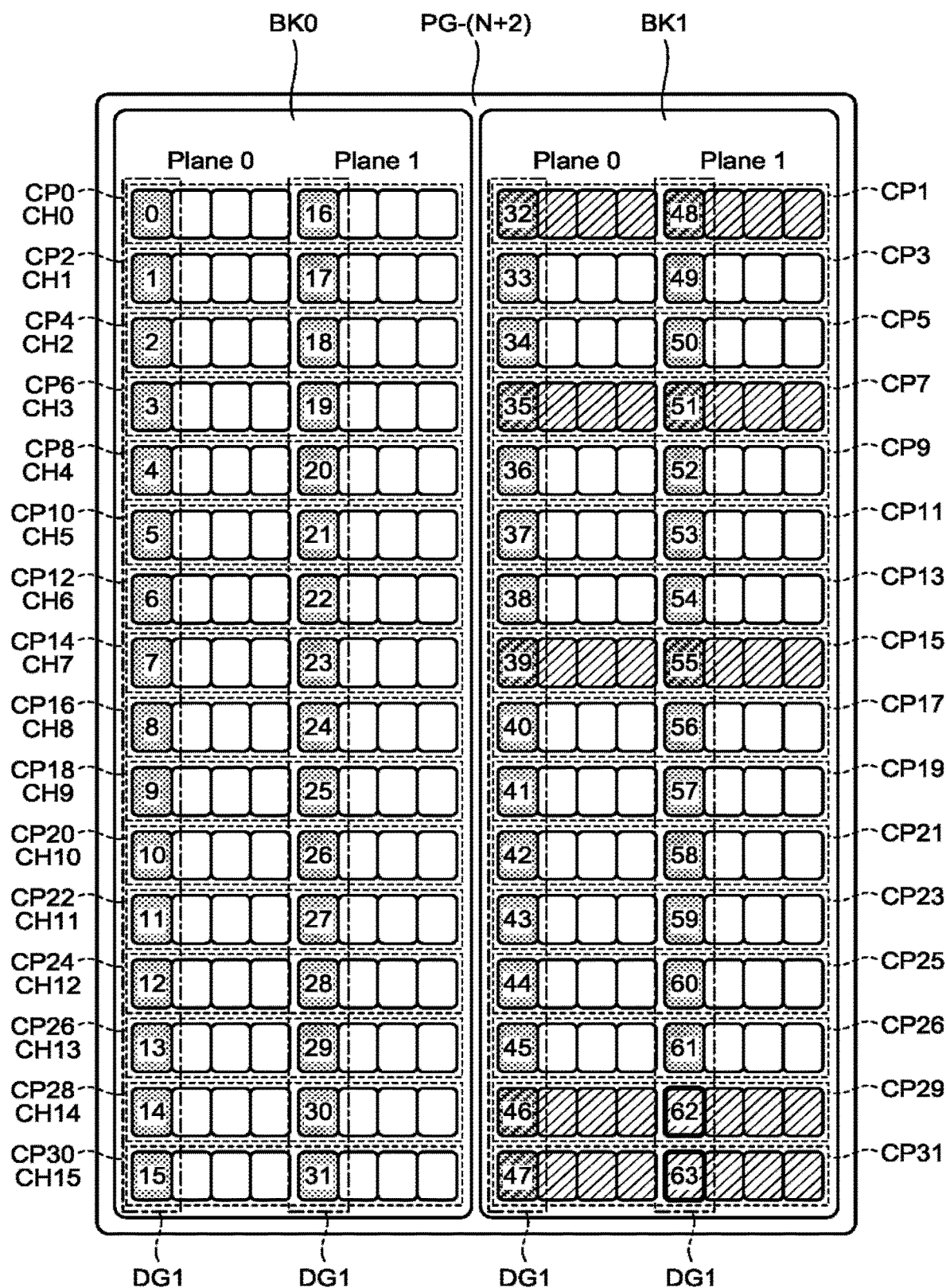
FIG. 3 is a diagram illustrating a configuration of a logical page in the embodiment.

For example, the logical page PG-(N+2) includes two banks BK0, BK1 as shown in FIG. 3. FIG. 3 is a diagram illustrating a configuration of the logical page PG-(N+2), and the other logical pages PG-0 to PG-(N+1) and PG-(N+3) are the same in configuration as the logical page PG-(N+2).

The banks BK0, BK1 are configured such that parallel operation by bank interleaving is possible. The bank BK0 includes memory chips CP0, CP2, CP4, CP6, CP5, CP10, CP12, CP14, CP16, CP18, CP20, CP22, CP21, CP26, CP28, and CP30 (hereinafter referred to as CP0 to CP30). The memory chips CP0 to CP30 in the bank BK0 can be accessed in parallel by the memory I/F 24 via the multiple channels CH0 to CH15. The bank BK1 includes memory chips CP1, CP3, CP5, CP7, CP9, CP11, CP13, CP15, CP17, CP19, CP21, CP23, CP25, CP27, CP29, and CP51 (hereinafter referred to as CP1 to CP31). The memory chips CP1 to CP31 in the bank BK1 can be accessed in parallel by the memory I/F 24 via the multiple channels CH0 to CH15. Each memory chip CP0 to CP31 can include multiple planes Plane0, Plane1 that can operate in parallel in the memory chip CP0 to CP31. Each memory chip CP0 to CP31 includes multiple memory cell arrays, some of which form one or multiple physical blocks.

Each physical block in the memory cell arrays of each memory chip CP0 to CP31 is configured as shown in, e.g., FIG. 4. FIG. 4 is a diagram illustrating a configuration of the physical block.

Each physical block comprises (p+1) number of NAND strings arranged along the X direction, where p≥0. A selection transistor ST1 included in each of the (p+1) number of NAND strings, has its drain connected to a bit line BL0 to BLp and its gate connected in common to a selection gate line SGB. A selection transistor ST2 has its source connected in common to a source line SL and its gate connected in common to a selection gate line SGS.

Each memory cell transistor MT is formed of a metal oxide semiconductor field effect transistor (MOSFET) having a stacked gate structure formed on a semiconductor substrate. The stacked gate structure includes a floating gate formed on the semiconductor substrate with a tunnel oxide film in between and a control gate electrode formed on the floating gate with an inter-gate insulating film in between. The threshold voltage changes according to the number of electrons stored in the floating gate. The memory cell transistor MT stores data according to the difference in threshold voltage. That is, the memory cell transistor MT holds a corresponding amount of charge to data in the floating gate.

In the NAND string, a (q+1) number of memory cell transistors MT are arranged between the source of the selection transistor ST1 and the drain of the selection transistor ST2 such that their current paths are connected in series, where q≥0. The control gate electrodes are connected to word lines WL0 to WLq respectively in the order of from the memory cell transistor MT located closest to the selection transistor ST1. Thus, the drain of the memory cell transistor MT connected to the word line WL0 is connected to the source of the selection transistor ST1, and the source of the memory cell transistor MT connected to the word line WLq is connected to the drain of the selection transistor ST2.

Each of the word lines WL0 to WLq (when the word lines are not distinguished, they are referred to as WL) connects in common to the control gate electrode of memory cell transistor MT of each NAND string in the physical block. In other words, the control gate electrodes of the memory cell transistors MT in the same row in the physical block are connected to the same word line WL. That is, the physical block includes multiple memory cell groups MG corresponding to multiple word lines WL, and each memory cell group MG includes a (p+1) number of memory cell transistors MT connected to the same word line WL. When each memory cell transistor MT is configured to be able to hold a one-bit value (when operating in a single level cell (SLC) mode), the (p+1) memory cell transistors MT (i.e., the memory cell group MG) connected to the same word line WL are dealt with as one physical page, and data programming and data read are performed for each such physical page.

Each memory cell transistor MT may be configured to be able to hold a multiple-bit value. For example, when each memory cell transistor MT can store an n-bit value, where n≥2, the storage capacity per word line WL is equal to the size of n number of physical pages. That is, each memory cell group MG is dealt with as n number of physical pages. For example, in a multi-level cell (PLC) mode where each memory cell transistor MT stores a two-bit value, in each word line ML, two physical pages worth of data is held. In a triple-level cell (TLC) mode where each memory cell transistor MT stores a three-bit value, in each word line WL, three physical pages worth of data is held.

Referring back to FIG. 1, the emergency save area 30 in the nonvolatile memory 7 is an area into which to write data in the volatile memory 22 (at least a write buffer 22a) using power from the backup battery 40 when a sudden disconnection of power supply to the power supply circuit 6 occurs. The emergency save area 30 can be configured to operate in the SLC mode because high-speed write operation is required of it. The storage area 31 is an area to store data. The storage area 31 can be configured to operate in the MLC or TLC mode because the data storage capacity is required to be secured.

The controller 5 is formed of, e.g., a semiconductor chip (SoC: System on a chip) such as a large-scale integrated circuit (LSI). The controller 5 controls data transfer between the host 2 and the nonvolatile memory 7 and so on.

In the controller 5, when receiving a write request and data to be written from the host 2, the host I/F 11 of the FE 10 transfers the write request and data to the BE 20. In the BE 20, the CPU 21 includes a write controller 21a, a block managing unit 21b, and a garbage collection (GC) manager 21c.

The write controller a has the ECC circuit 23 perform error correction code processing on the data to generate symbols including a data part corresponding to the data and an error correction code and to store in the volatile memory 22 temporarily.

In this case, the ECC circuit 23 can perform, for example, four tiers of error correction code processing, that is, a first ECC code (a code generated by L1 error correction code processing or an L1 code), a second ECC code (a code generated by L2 error correction code processing or an L2 code), a third ECC code (a code generated by L3 error correction code processing or an L3 code), and a fourth ECC code (a code generated by L4 error correction code processing or an L4 code). The degree of dispersion in encoding is higher in the order of the L1 code, L2 code, L3 code, and L4 code. For the L1 code and L2 code, data to be encoded is in one memory chip, whereas for the L3 code and L4 code, data to be encoded is spread across multiple memory chips.

The write controller 21a writes the symbols temporarily stored in the volatile memory 22 into the nonvolatile memory 7 via the memory I/F 24.

The volatile memory 22 is a volatile semiconductor memory capable of higher access than the nonvolatile memory 7, and a static random access memory (SRAM) or dynamic random access memory (DRAM) is used as that memory. FIG. 1 illustrates a case where the volatile memory 22 is a DRAM.

The volatile memory 22 includes the write buffer 22a and a garbage collection (GC) buffer 22b. The write buffer 22a temporarily stores write data that the host 2 has made a request to write. When GC is performed in the memory system 1, the GC buffer 22b temporarily stores data on which to perform GC.

The GC manager 21c controls the operation of each component associated with GC using the GC buffer 22b. The GC is a process of sorting not-used logical pages in logical blocks. By performing the GC, logical pages spread and being used are gathered together in one logical block so as to secure free blocks.

For example, under control associated with the GC by the GC manager 21c, the memory I/F 24 reads symbols (=a data part+an error correction code) from the nonvolatile memory 7, and the ECC circuit 23 performs error-correction decoding on the data part of the read symbols using the error correction code to reconstitute into original data.

At this time, the ECC circuit 23, for example, performs L1 error-correction decoding and, if an L1 error occurs, performs L2 error-correction decoding and, if an L2 error occurs, performs L3 error-correction decoding and, if an L3 error occurs, performs L4 error-correction decoding. As such, the ECC circuit 23 can perform error-correction decoding while enlarging the scale stepwise in the order of L1, L2, L3, and L4 until succeeding in error-correction decoding.

The block managing unit 21b manages the logical blocks in the nonvolatile memory 7. The block managing unit 21h assigns some of the multiple logical blocks as the emergency save area 30 and the remaining (most) logical blocks as the storage area 31. Further, the block managing unit 21b manages the number of free blocks that are logical blocks into which to be able to write data, the rates of valid data in logicals, and so on. When short of free blocks in number, the block managing unit 21b has the GC manager 21c perform ttie GC, thereby increasing the number of free blocks.

The memory I/F 24 controls the operation of the nonvolatile memory 7. The memory I/F 24 issues a write command in response to a write request from the host 2 to supply (output) the write command and data to the nonvolatile memory 7. The nonvolatile memory 7 writes the data into memory cells according to the write command. The memory I/F 24 issues a read command in response to a read request from the host 2 to supply (output) the read command to the nonvolatile memory 7. The nonvolatile memory 7 reads data from memory cells according to the read command to supply tc the memory I/F 24.

The volatile memory 22 stores address conversion information 22c and block management information 22d. Write requests from the host 2 received by the host I/F 11 include a logical address (LBA) to designate a write destination. Read requests from the host 2 received by the host I/F 11 include a logical address (LBA) to designate a target to read from.

For example, in the memory system 1, internal data management is performed by the controller 5 on a cluster basis, and the updating of data from the host 2 is performed on a sector basis. It is assumed that a logical page PG as shown in FIG. 3 is a unit of multiple clusters gathered together and that the cluster is a unit of multiple sectors gathered together. The sector is a minimum access unit of data from the host 2. The sector has a size of, e.g., 512 B, and the cluster has a size of, e.g., 4 KB. The host 2 can designate data to access by logical block addressing (LBA) on a sector basis.

Referring back to FIG. 1, the address conversion information 22c is used in performing address conversion between a logical address specified by the host 2 and a physical address in the nonvolatile memory 7. The address conversion information 22c can be, for example, in the form of a table (as a logical-physical conversion table). In the address conversion information 22c, logical addresses are associated with physical addresses. In writing symbols temporarily stored in the volatile memory 22 into the nonvolatile memory 7 via the memory I/F 24, the write controller 21a can update the address conversion information 22c such that logical addresses corresponding to the symbols are associated with physical addresses in the nonvolatile memory 7.

The block management information 22d is used in managing the logical blocks in the nonvolatile memory 7 and can be updated by the block managing unit 21b as needed. The block management information 22d can be, for example, in the form of a table (as a logical block management table). The block management information 22d can include information about logical blocks (bad blocks) including a memory chip (defective memory chip) containing a memory cell regarded as having a defect. That is, having received the result of error-correction decoding from the ECC circuit 23, the block managing unit 21b regards memory chips for which error correction failed in error-correction decoding (even with enlarging the scale of error correction in the order of L1, L2, L3, and L4) as defective memory chips to register logical blocks including the defective memory chips into the block management information 22d. Thus, the block management information 22d can be updated. The defects may be managed on the basis of physical blocks or physical pages in memory chips.

The power supply circuit 6 supplies power sent from the external power supply 4 to the controller 5 and the nonvolatile memory 7. Further, the power supply circuit 6 supplies power sent from the external power supply 4 to the backup battery 40 to charge the backup battery 40. The backup battery 40 is, for example, an electric double layer capacitor, an electrolytic capacitor, a ceramic capacitor, a secondary battery, or the like.

The backup battery 40 stores power sent from the external power supply 4. When power sent from the external power supply 4 stops suddenly (when a sudden power supply disconnection occurs), the backup battery 40 supplies saved power to the controller 5 and the nonvolatile memory 7. The case when a sudden power supply disconnection occurs refers to, for example, the case when power sent from the external power supply 4 to the power supply circuit 6 is cut off at a timing which the user does not intend for happening at, or the like.

The power supply circuit 6 monitors power sent from the external power supply 4 to the power supply circuit 6 and, if the power is at or above a predetermined threshold level, determines that power is being normally supplied and can supply the power from the external power supply 4 to each component. The power supply circuit 6, if the power from the external power supply 4 is below the predetermined threshold level, determines that a power supply disconnection has occurred and switches to drive by the backup battery 40 and can supply the power from the backup battery 40 to each component.

The memory system 1 has a power loss protection (PLP) function of protecting data corresponding to a write request. The PLP function is for ensuring the permanence of data for which a write-completion response has been made even if a sudden power supply disconnection occurs. In other words, the PLP function is for storing the data so that data which seems already written to the host 2 is not lost even when a sudden power supply disconnection occurs.

Next, a function (multi-write processing function) of the memory system 1 corresponding to a multi-stream function of the host 2 will be described.

In the memory system 1, an equal number of logical pages to the number of streams may need to be simultaneously opened in order to support a write operation corresponding to the multi-stream function of the host 2. For example, as shown in FIG. 2, because the number of channels×the number of banks=16×2=32, an equal number of parallel operations (multi-write operation process) to the number (=32) of streams are possible. In the multi-write operation process, writing in parallel into multiple regions in a logical page PG via the channels CH0 to CH15 is performed sequentially for multiple logical pages PG-0 to PG-(N+3) (in page-number order).

Thus, the number of logical pages PG which can be being written into simultaneously can become large (e.g., a maximum of 32). FIG. 2 illustrates the case where the logical pages PG being written into are three logical pages PG-N, PG-(N+1), and PG-(N+2). In the leading page PG-(N+2) being written into (=the most progressing logical page in writing=the highest numbered logical page of the logical pages PG being written into), for example, memory chips CP1, CP7, CP15, CP29, and CP31 are being written into as indicated by oblique hatching in FIG. 3.

As shown in FIG. 3, in the logical page PG-(N+2), the data group DG1 enclosed by dot-dashed lines is a data group corresponding to an L3 error correction code (also called an L3 error correction group). The data group DG1 includes the leading cluster of data in each plane Plane0, Plane1 of each memory chip CP0 to CP31. An L3 number from 0 to 63 (a number to identify one of the clusters of data belonging to the data group DG1) is assigned to each cluster in the data group DG1. The L3 error correction code processing can generate a third ECC code (L3 code) for the clusters of data designated by L3 numbers 0 to 61. In the L3 error correction code processing, the data part of symbols is stored as the clusters of data designated by L3 numbers 0 to 61 into the volatile memory 22, and the L3 code is stored as the clusters of data designated by L3 numbers 62, 63. The L3 code is generated with being updated sequentially for already written data, data currently being written, and not-yet written data (duty data) while the clusters of data designated by L3 numbers 0 to 61 are being written into the storage area 31 and is held in the volatile memory 22 until the completion of writing all the clusters of data in the data group (L3 error correction group) DG1. The L3 code is written into the storage area 31 after the completion of writing all data in the data group (L3 error correction group) DG1 into the storage area 31.

When a sudden power supply disconnection occurs, to finish writing logical pages PG being written into the storage area 31 may increase the number of logical pages PG to finish writing to a large number, and thus it may be difficult to finish writing logical pages PG being written using the power of the backup battery 40.

If the capacity (e.g., the number of capacitors) of the backup battery 40 to be mounted in the memory system 1 is increased to deal with this, component cost may increase, so that the production cost of the memory system 1 may increase, and since the startup time for charging the backup battery (e.g., capacitors) 40 may increase, the performance of the memory system 1 may decrease.

Hence, in order to suppress an increase in the capacity of the backup battery 40, it can be thought of that when a sudden power supply disconnection occurs, an error correction code is generated and saved into the emergency save area 30 while not finishing writing logical pages PG being written into the storage area 31, that after power return, already written data is read from the storage area 31 while the error correction code is read from the emergency save area 30, and that the missing portions of logical pages PG being written are filled with dummy values (e.g., bit values of 0) to generate symbols. In this case, if an L1/L2 error occurs in performing error-correction decoding on data of logical pages PG being written during operation, then L3/L4 error-correction decoding is performed, but symbols used in the L3/L4 error-correction decoding are different from those in error-correction code processing. That is, in the error-correction code processing, the error correction code is generated using both already written data and not-yet written data of logical pages PG being written, whereas, in the error-correction decoding, the error-correction decoding using the error correction code is performed on already written data and the dummy values of logical pages PG being written. Thus, the L3/L4 error-correction decoding may not be able to reconstitute data appropriately.

Hence, the memory system 1 according to the present embodiment saves not-yet written data and information about save locations for that data into the emergency save area 30 at the time of power supply disconnection and, on power return, reads those to reproduce symbols of logical pages PG used in generating an error correction code and including not-yet written portions and performs the error-correction decoding. By this means, with the memory system 1 according to the present embodiment, both suppressing an increase in the capacity of the backup battery 40 and improving the accuracy of the L3/L4 error-correction processing can be achieved.

Specifically, the memory system 1 performs an operation as shown in FIG. 5 relating to the time when a sudden power supply disconnection occurs. FIG. 5 is a flow chart illustrating the operation of the memory system 1 at a time of power supply disconnection.

The memory system 1 performs normal operation until detecting an occurrence of power supply disconnection (No at S1) and, when detecting an occurrence of power supply disconnection (Yes at S1), stops accepting a write request from the host 2 (S2). The memory system 1 stops writing into the storage area 31 of the nonvolatile memory 7 (S3). That is, the memory system 1 causes the memory I/F 24 to discard a write command to write into the storage area 31 and the memory I/F 24 itself to stop. The memory system 1 saves not-yet written data (write data requested by the host to write and held in the write buffer 22a in the volatile memory 22) and cluster data of a log and cluster data of an L3 code into the emergency save area 30 to make those nonvolatile (S4). The log is information about an update (difference) of the entry when a change is made to a certain entry of management information in the nonvolatile memory 7 and is, for example, an update difference of the address conversion information 22c.

The memory system 1 identifies the number of the leading page being written into (=the number of the most progressing logical page in writing) and generates and causes leading page information 22f to be held in the volatile memory 22 (S5). In the case shown in FIG. 2, the memory system 1 identifies PG-(N+2) as the leading page number and generates leading page information 22f indicating the leading page number PG-(N+2).

The memory system 1 extracts the write command discarded in the memory I/F 24 and generates and causes discarded-host write information 22e to be held in the volatile memory 22 (S6). At this time, the memory system 1 extracts a write command discarded for each memory chip of each logical page PG and generates, in the case of FIG. 2, discarded-host write information 22e for each memory chip being written into of logical pages PG-N to PG-(N+2) being written into.

The discarded-host write information 22e has, for example, a data structure as shown in FIGS. 6A to 6D. FIGS. 6A to 6D are diagrams illustrating the data structure of the discarded-host write information 22e.

If the discarded write command is a command from the host 2 to write data, as shown in FIG. 6A, the discarded-host write information 22e contains the storage location of data (e.g., logical block number BL0/logical page number PG-(N+1)/channel number CH3/bank number BK1), the type of information (Data), and an address in the volatile memory 22 (e.g., VADD-35).

If the discarded write command is a command instructing to do an empty write or invalid write, as shown in FIG. 6B, the discarded-host write information 22e contains the storage location of data (e.g., logical block number BL0/logical page number PG-(N+3)/channel number CH0/bank number BK0) and the type of information (Null).

For example, if the command sequence of a write command includes a write instruction (Cmd80h-Adr-DataIn-Cmd10h), access processing (tProg), and a status read instruction (Cmd70-StatusOut), the write command being an empty write means that data designated by the data designating part "Datain" of the write instruction is empty (not designated). The write command being an invalid write means that the write destination designated by the address specifying part "Adr" of the write instruction is a logical block (bad block) including a defect memory chip in the storage area 31 and that a write error occurs when the command is executed.

If the discarded write command is a command to write a log, as shown in FIG. 6C, the discarded-host write information 22e contains the storage location of data (e.g., logical block number BL0/logical page number PG-(N+3)/channel number CH7/bank number BK1), the type of information (Log), and an address in the volatile memory 22 (e.g., VADD-46).

If the discarded write command is a command to write an L3 code, as shown in FIG. 6D, the discarded-host write information 22e contains the storage location of data (e.g., logical block number BL0/logical page number PG-(N+2)/channel number CH14/bank number BK1), the type of information (L3), and an address the volatile memory 22 (e.g., VADD-62).

These discarded-host write information 22e may be provided for each logical block or be in the form of table with all together or be gathered together for each type of data.

Referring back to FIG. 5, the memory system 1 saves not-yet written data (WB dirty) held in the write buffer 22a, the leading page information 22f generated at S5, the discarded-host write information 22e generated at S6, and other for-reconstitution management data into the emergency save area 30 to make those nonvolatile (S7). The WB dirty (not-yet written data) is write request data designated by a write request from the host 2 and is temporarily stored in the write buffer 22a.

The memory system 1 performs an operation as shown in FIG. 7 relating to the time of power return. FIG. 7 is a flow chart illustrating the operation of the memory system 1 at a time of power return.

The memory system 1 waits until detecting power return (No at S11) and, when detecting power return (Yes at S11), loads the log, L3 code, WB dirty (not-yet written data), leading page information 22f, and discarded-host write information 22e saved in the emergency save area 30 of the nonvolatile memory 7 into the volatile memory 22 (S12). At this time, the log, L3 code, and WB dirty (data) are loaded into the volatile memory 22 at address locations (see FIG. 6) specified by the discarded-host write information 22e.

The memory system 1 generates write status information 22g indicating the write status a logical block based on the leading page information 22f and discarded-host write information 22e loaded, to store into the volatile memory 22 (S13). The discarded-host write information 22e has been generated for each memory chip being written into of logical pages PG-N to PG-(N+2) being written into. Thus, the memory system 1 can generate the write status information 22g indicating the write status of the logical block containing logical pages PG being written into for the logical block containing logical pages PG being written into.

Figure 8:
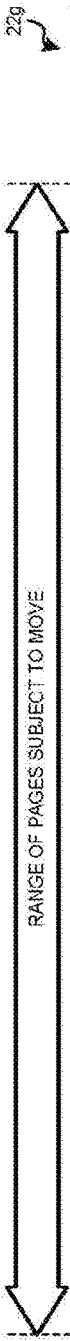
FIG. 8 is a diagram illustrating write status information (a write status map) in the embodiment.

The memory system 1 can generate the write status information 22g, for example, in the form of a map (as a write status map) as shown in FIG. 8. FIG. 8 is a diagram illustrating the write status information (write status map) 22g for logical block BL0.

In FIG. 8, a term "slot" is used as an index of each of multiple memory chips forming the logical block BL0. In this embodiment, the slot corresponds to a combination of a channel number and a Lank number. That is, slot SL0 corresponds to channel CH0 and bank BK0; slot SL1 corresponds to channel CH1 and bank BK0; . . . ; and slot SL31 corresponds to channel CH15 and bank BK1. Banks 0, 1 of the same channel may be in the same memory chip.

The write status information 22g indicates distinguishably either "already written" or "discarded" for each memory chip of each logical page PG. The discarded-host write information 22e as shown in FIGS. 6A to 6D can be associated with places labelled "discarded". For example, the write status information 22g is configured such that its corresponding discarded-host write information 22e can be referred to when a place labelled "discarded" is designated.

Referring to the write status information 22g shown in FIG. 8, it is seen that, although writing into the storage area 31 has been finished for all the slots SL0 to SL31 in each of logical pages PG-0 to PG-(N−1), logical pages PG-N to PG-(N+2) are being written into. Slots for which a write command has been discarded exist in each of logical pages PG-N to PG-(N+2). In logical page PG-N, a write command has been discarded for memory chips corresponding to slots SL16, SL30, and SL31. In logical page PG-(N+1), a write command has been discarded for memory chips corresponding to slots SL16, SL19, SL30, and SL31. In logical page PG-(N+2), a write command has been discarded for memory chips corresponding to slots SL16, SL19, SL23, SL30, and SL31.

Referring to the write status information 2g shown in FIG. 8, regions indicated by oblique hatching are unused (not-yet written) memory chips and, if the nonvolatile memory 7 is a NAND flash memory, may not be able to be overwritten. In order to store data of each memory chip of a logical page into the storage area 31 at consecutive addresses, a data move process (process of writing data of a logical page being written into a new logical block (free block)) can be used. In FIG. 8, logical page PG-(N+3), for which operations of writing into the nonvolatile memory 7 according to write commands for all the slots SL0 to SL31 have been discarded, can be said to be a logical page practically not written. Thus, by referring to the write status information 22g, it can be found out that the logical pages PG-N to PG-(N+2) are a range of pages subject to a move (a range needing the data move process).

Referring back to FIG. 7, the memory system 1 reads already-written data of the logical pages PG-N to PG-(N+2) being written into from the storage area 31 and causes to be held in the volatile memory 22 (S14).

The memory system 1 performs L1/L2 error-correction decoding on the data held in the volatile memory 22 and, if an L1/L2 error does not occur (No at S15), stores data reconstituted by error-correction decoding into the nonvolatile memory 7 (320).

On the other hand, the memory system 1 performs L1/L2 error-correction decoding on the data held in the volatile memory 22 and, if an L1/L2 error occurs (Yes at S15), generates symbol read information 22h based on the discarded-host write information 22e to store into the volatile memory 22 (S16).

For example, in the write status information 22g shown in FIG. 8, when a place labelled "discarded" is designated, its corresponding discarded-host write information 22e is referred to, so that, if the data type is "Data", "Log", or "L3", a reference location (address) in the volatile memory 22 can be acquired (see FIGS. 6A, 6C, 6D).

Thus, the memory system 1 can generate the symbol read information 22h as shown in FIG. 10 about the logical page PG-(N+2) shown in FIG. 3. The symbol read information 22h can be generated, for example, in the form of a table as shown in FIG. 10 (as a symbol lead table). FIG. 10 is a diagram illustrating the symbol read information (symbol read table) 22h. In the symbol read information 22h, an L3 number 22h1 is associated with location information 22h2 for multiple L3 numbers. For example, because L3 number 0 is "already written" (see FIG. 8), a reference location (physical address NVADD-0) in the storage area 31 is recorded. Because L3 number 35 is a log cluster for which a write command has been discarded (see FIG. 8), a reference location (address VADD-35) in the volatile memory 22 is recorded (see FIG. 6C). Because L3 number 39 is a cluster in which empty information (Null) is already written, a value indicating being invalid (ALL FF: A bit pattern where all the bits are 1) is recorded (see FIG. 6B). Because L3 number 62 is an L3 cluster for which a write command has been discarded (see FIG. 8), a reference location (address VADD-62) in the volatile memory 22 is recorded (see FIG. 6D). Likewise, because L3 number 63 is an L3 cluster for which a write command has been discarded (see FIG. 8), a reference location (address VADD-63) in the volatile memory 22 is recorded. That is, by referring to the symbol read information 22h, the reference location of each cluster in the data group (L3 error correction group) corresponding to the error correction code can be identified.

Referring back to FIG. 7, the memory system 1 performs error-correction decoding based on the L3 error correction code and the symbol read information 22h generated at S16. The memory system 1 reads already written data from reference locations (addresses) in the storage area 31 specified by the symbol read information 22h and not-yet written data from reference locations (addresses) in the volatile memory 22 specified by the symbol read information 22h (S17) and reconstructs those as symbols of the data group (L3 error correction group) for L3 correction in the GC buffer 22b. The memory system 1 performs error-correction decoding using the L3 code (designated by L3 numbers 62 and 63 in the case of FIG. 10) on the data part (designated by L3 numbers 0 to 61 in the case of FIG. 10) of the reconstructed symbols (S18).

If an L3 error does not occur (No at S19), the memory system 1 stores ata reconstituted by error-correction decoding into the nonvolatile memory 7 (S20).

If an L3 error occurs (Yes at S19), the memory system 1 notifies the occurrence of an L3 error to the host 2 and ends the process.

As such, the memory system 1 according to the embodiment saves not-yet written data and the discarded-host write information 22e relating to save locations for that data into the emergency save area 30 at the time of power supply disconnection and, on power return, reads those to reproduce symbols of logical pages PG used in generating an error correction code and including portions not yet written into the storage area 31 and performs error-correction decoding (e.g., L3 error-correction decoding) across multiple memory chips. By this means, at the time of power supply disconnection, information necessary for error correction across multiple memory chips can be saved into the emergency save area 30 within the range of power that can be supplied by the backup battery 40, and after power return, symbols to be used in error-correction decoding across multiple memory chips can be made to almost coincide with symbols used in error-correction code processing across the multiple memory chips immediately before the power supply disconnection. As a result, while suppressing an increase in the capacity of the backup battery 40, the accuracy of the error-correction processing across multiple memory chips can be improved, so that data can be reconstituted appropriately. Thus, an increase in the production cost of the memory system 1 can be suppressed, and the reliability of data of the memory system 1 can be improved.

The concept of the present embodiment can be applied to operation of performing the power loss protection (PLP) while not finishing writing logical pages PG being written at the time of power supply disconnection even if the memory system 1 does not have or use a multi-write processing function, not being limited to the case where the memory system 1 has a function (multi-write processing function) supporting the multi-stream function of the host 2.

Or performing L3 error-correction decoding using the symbol read information 22h (S15 to 318 of FIG. 7) may be executed not only at power-on but also in normal operation (for example, in a read operation according to a read request from the host 2).

Or although the embodiment illustrates the case where logical pages PG being written into do not include a defective memory chip, if physical address locations assigned to cluster data of an L3 code and cluster data of a log (correction information and management information necessary in a page) are in a defective memory chip, a defect avoiding process may be performed. The defect avoiding process is a process of making storage locations registered as locations in a defective memory chip by the block managing unit 21b be not accessed by the write controller 21a (unusable). With defective memory chips, there are cases where, although a defect exists innately, it is not exposed because of being unused and where a defect occurs due to degradation in a posterior manner. In either case, in the defect avoiding process, in response to the revelation that a defect exists in storage locations into which to write cluster data of an L3 and cluster data of a log within the data group (L3 error correction group) corresponding to the L3 code, instead of these storage locations, the controller 5 (CPU 21) can assign storage locations (e.g., the preceding cluster in the same correction group) for other cluster data in the data group (e.g., in the data group DG1 shown in FIG. 3) that is an L3 error correction group. The write controller 21a can control the memory I/F 24 to issue write commands according to this assignment. Note that, in this process, the controller 5 (CPU 21) can change storage locations in such a way as to make another logical page include storage locations for cluster data that were assigned to the destinations newly assigned.

Figure 12:
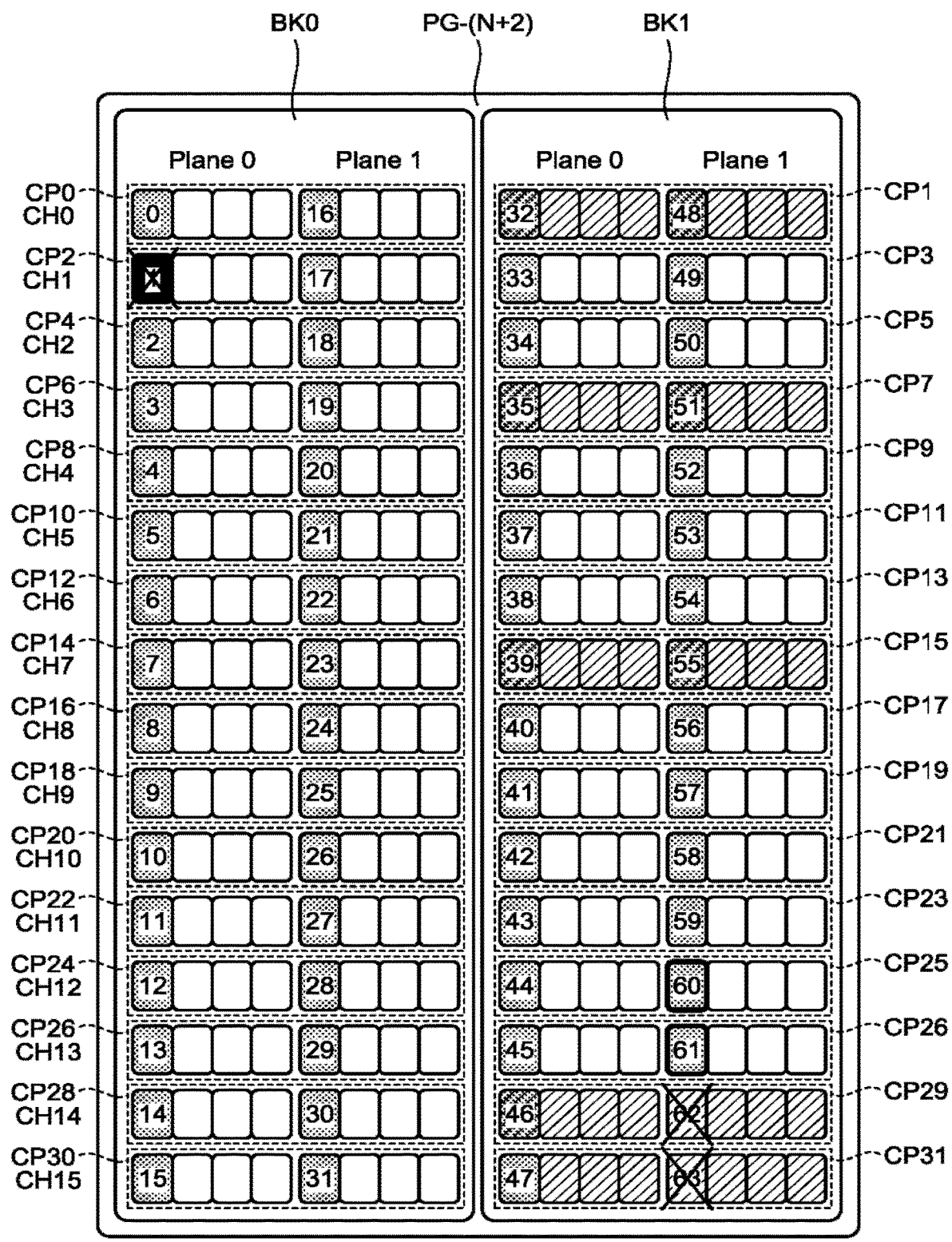
FIG. 12 is a diagram illustrating a defect avoiding process in the modified example of the embodiment.

For example, it is assumed that the memory system 1 refers to the block management information 22d as shown in FIG. 11 to find out that slots SL29, SL31 in the logical page PG-(N+2) of the logical block PL0 include defective memory chips. FIG. 11 is a diagram illustrating the block management information (logical block management table) 22d. In this case, as shown in FIG. 12, the memory system 1 finds out that the leading cluster (cluster L3-numbered in an L3 error correction group) of Plane1 of a memory chip CP29 and the leading cluster (cluster L1-numbered 63 in the same group) of Plane1 of a memory chip CP31 in the logical page PG-(N+2) are unusable. FIG. 12 is a diagram illustrating the defect avoiding process. The memory system 1 changes the write destination for an L3 code that has been scheduled to be written into clusters L3-numbered 62, 63 to clusters L3-numbered 60, 61 and registers clusters L3-numbered 62, 63 as being not for use in the block management information 22d. At this time, cluster data that was scheduled to be written into clusters numbered 60, 61 can be driven out and assigned as cluster data of another logical page PG.

Figure 13:
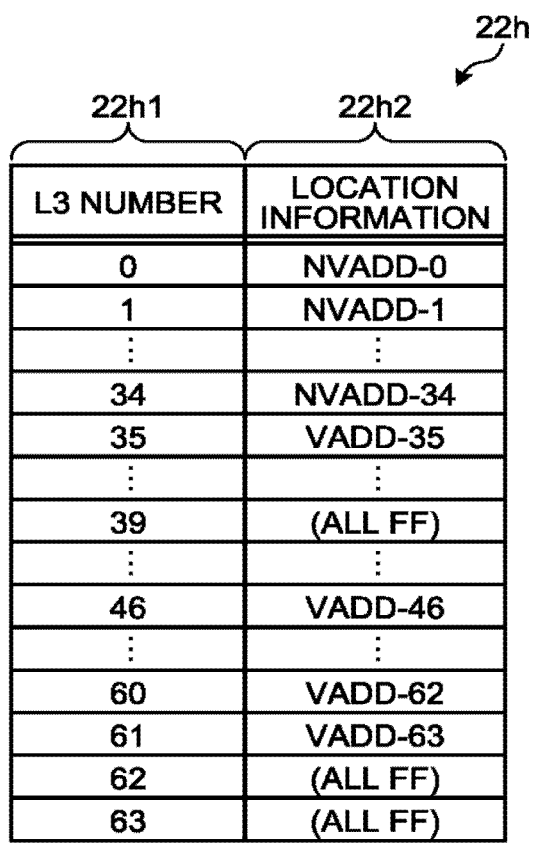
FIG. 13 is a diagram illustrating symbol read information (a symbol read table) in a case where the defect avoiding process is performed in the modified example of the embodiment.

In this case, the memory system 1 refers to the block management information 22d as well as the write status information 22g at 316 of FIG. 7 to generate symbol read information 22h as shown in FIG. 13. In comparison with the symbol read information 22h shown in FIG. 10, L3 numbers corresponding to reference locations (address VADD-62, address VADD-63 in the volatile memory 22 for cluster data of L3 are changed from 62, 63 to 60, 61. In numbers 62, 63, as storage locations (Null) in an invalid defective memory chip, a value indicating being invalid (ALL FF: A bit pattern where all the bits are 1) is recorded (see FIG. 6B). Thus, the memory system 1 can appropriately perform error-correction decoding on the data part of the data group corresponding to an L3 code while avoiding storage locations contained in the defective memory chip at S17 shown in FIG. 7. In the case of FIG. 13, although the number of clusters in the L3 error correction group decreases, the controller 5 (CPU 21) can drive out cluster data that was scheduled to be written into clusters L3-numbered 60, 61 and assign as cluster data of another logical page PG.

Or the write buffer 22a may be configured taking into account a fill-in-the-blank read process. For example, a cluster that is a data management unit in the nonvolatile memory 7 is larger than a sector that is a management unit for data designated by a write request from the host 2. Hence, in writing data into the nonvolatile memory 7, when sector data (other sector data) of the same cluster address as to-be-written sector data corresponding to the write request exists in the nonvolatile memory 7, the memory system 1 performs the fill-in-the-blank read process of reading the other sector data from the nonvolatile memory 7 to merge with the to-be-written sector data so as to generate data in a cluster unit (a cluster of data). If a sudden power supply disconnection occurs during or before the fill-in-the-blank read process, the memory system 1 cannot finish the fill-in-the-blank read process for the other sector but performs L3 error-correction code processing using cluster data merged with not-guaranteed data (e.g., data of 0 s and 1 s mixed) present in the volatile memory (DRAM) instead of the other sector data to generate an L3 code. Then the memory system 1 saves cluster data including the to-be-written sector data and the not-guaranteed data and an L3 code generated based on this cluster data into the nonvolatile memory 7 (the emergency save area 30). Then on power return, the saved cluster data (the to-be-written sector data and the not-guaranteed data) and L3 correction code are restored from the emergency save area 30 into the volatile memory 22 (the write buffer 22a) and the fill-in-the-blank read process is performed for the restored cluster data. Thus, the not-guaranteed data is replaced with data whose values are guaranteed (correct other sector data). When the cluster data having the blank filled in cannot be corrected by L1 error-correction decoding, error-correction decoding is performed using the restored L3 correction code, but the correction fails (cannot be done) because the contents of the cluster data are different between when encoding and when decoding. Thus, also at the time of L3 error-correction decoding, the not-guaranteed data when the L3 correction code was generated is necessary. However, when the fill-in-the-blank read process is performed for the restored cluster data, sector data other than the to-be-written sector data out of the cluster data is filled with the correct other sector data to perform the L3 error-correction decoding. That is, because of the fill-in-the-blank reading, the not-guaranteed data is overwritten with the data whose values are guaranteed so as to disappear.

Hence, the memory system 1 includes a temporary buffer region 22a1 and a main buffer region 22a2 in the write buffer 22a so that the not-guaranteed data necessary for L3 error-correction decoding is not overwritten but certainly remains in the write buffer 22a until L3 error-correction decoding. The temporary buffer region 22a1 temporarily holds data to be stored in the main buffer region 22a2 and holds, for example, data necessary for computation in L3 error-correction decoding. The main buffer region 22a2 temporarily holds data to be stored in the nonvolatile memory 7 and holds, for example, part of data on which L3 error-correction decoding was performed.

For example, at S12 of FIG. 7, the memory system 1 reads not-yet written data (WB dirty) of a specified logical page PG from the emergency save area 3C into the temporary buffer region 22a1 as indicated by a solid arrow in FIG. 14. At S14 of FIG. 7, the memory system 1 reads already written data of the specified logical page PG from the storage area 31 into the temporary buffer region 22a1 as indicated by a solid arrow in FIG. 14. Thus, data of the specified logical page PG including already written data and not-yet written data (WB dirty) is reconstructed in the temporary buffer region 22a1, so that L3 error-correction decoding can be performed appropriately.

The memory system 1 executes S16 to S18 of FIG. 7 and, if an L3 error does not occur (No at S19), transfers (copies or moves) selectively data of at least valid part (indicated by oblique lines in FIG. 14) of the specified logical page PG from the temporary buffer region 22a1 into the main buffer region 22a2 as indicated by a broken-line arrow in FIG. 14.

The size of each cluster of data transferred into the main buffer region 22a2 may be smaller than the data size (e.g., 4 KB) of a unit in writing into the nonvolatile memory 7. Hence, the memory system 1 performs the fill-in-the-blank read process at S20 of FIG. 7. For example, the memory system 1 reads other data corresponding in size to the missing portions (other sector data of the same cluster address) from the storage area 31 into the main buffer region 22a2 as indicated by a dot-dashed arrow in FIG. 14 to add to the data transferred from the temporary buffer region 22a1. Thus, each cluster of data of the data size of the unit in writing into the nonvolatile memory can be formed, so that the memory system 1 stores, for example, one logical page worth of data formed by the fill-in-the-blank read process into a region corresponding in size to one logical page of another logical block in the storage area 31 as indicated by a two-dot-dashed arrow in FIG. 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory having a first memory area including multiple chips and a second memory area; and
   a controller configured to
   write a first data among write data to be written across the multiple chips of the first memory area into part of the first memory area and write, in response to a power supply disconnection being detected before writing a second data among the write data into the first memory area, the second data and a first information about a storage location where the second data are to be stored into the second memory area,
   read, in response to a power return being detected, the first data from the part of the first memory area, and read the first information from the second memory area,
   generate a second information about a reference location to access the second data based on the read first information,
   read the second data from the second memory area to store the read second data based on the generated second information, and
   write the read first data and the stored second data into another part of the first memory area.

2. The memory system according to claim 1, wherein
   the controller is configured to write an error correction code generated based on the write data into the second memory area in response to the power supply disconnection being detected, read the error correction code from the second memory area in response to the power return being detected, and performs error-correction decoding based on the read error correction code if an error in part of the read first data or the stored second data cannot be corrected.

3. The memory system according to claim 2, wherein
   the first information includes data locations of not-yet written data in a data group corresponding to the error correction code in the first memory area and an address relating to a location into which to be saved.

4. The memory system according to claim 3, further comprising
   a volatile memory including a write buffer,
   wherein the address relating to the location into which to be saved includes an address in the write buffer corresponding to an address in the second memory area at which the not-yet written data is to be stored.

5. The memory system, according to claim 4, wherein
   in the second information, for multiple pieces of data included in the data group, identification information corresponding to the error correction code is associated with address information,
   wherein an address information of already written data includes an address in the first memory area, and
   wherein an address information of the not-yet written data includes an address in the write buffer.

6. The memory system according to claim 5, wherein
   the write buffer includes a first buffer region and a second buffer region to temporarily hold information to be stored in the first buffer region,
   wherein the address information of the not-yet written data includes an address in the second buffer region, and
   wherein the controller is configured to read out the already written data and the not-yet written data into the second buffer region based on the second information, perform error-correction decoding thereon, store data after error-correction decoding into the first buffer region, add other data to adjust data size, and write data after the adjustment into the first memory area.

7. The memory system according to claim 1, wherein
   the nonvolatile memory has a plurality of the first memory areas,
   wherein when executing a multi-write process of, sequentially for the plurality of first memory areas, writing into multiple regions in the first memory area via multiple channels in parallel, the controller is configured to generate a third information indicating a write status of the first memory area according to the first information and generate the second information according to the first information and the third information.

8. The memory system according to claim 7, wherein
   in the third information, for multiple data locations, a data location in the first memory area is associated with a data write status.

9. The memory system according to claim 7, wherein
in the write status, information indicating a location in the first memory area where data are to be written is associated with information indicating whether or not data are written.

10. The memory system according to claim 7, wherein
in the write status, information identifying a channel, information distinguishing the first memory area from the other first memory areas, information indicating a location to write data in the first memory area, and information indicating whether or not data are written are associated with each other.

11. A control method for a memory system which includes a nonvolatile memory having a first memory area including multiple chips and a second memory area, the control method comprising:
writing a first data among write data to be written across the multiple chips of the first memory area into part of the first memory area and writing, in response to a power supply disconnection being detected before writing a second data among the write data into the first memory area, the second data and a first information about a storage location where the second data are to be stored into the second memory area;
reading, in response to a power return being detected, the first data from the part of the first memory area, and reading the first information from the second memory area;
generating a second information about a reference location to access the second data based on the read first information;
reading the second data from the second memory area to store the read second data based on the generated second information; and
writing the read first data and the stored second data into another pan of the first memory area.

12. The control method according to claim 11, further comprising:
writing an error correction code generated based on the write data into the second memory area in response to the power supply disconnection being detected;
reading the error correction code from the second memory area in response to the power return being detected; and
performing error-correction decoding based on the read error correction code if an error in part of the read first data or the stored second data cannot be corrected.

13. The control method according to claim 12, wherein
the first information includes data locations of not-yet written data in a data group corresponding to the error correction code in the first memory area and an address relating to a location into which to be saved.

14. The control method according to claim 13, wherein
the memory system further includes a volatile memory including a write buffer,
wherein the address relating to the location into which to be saved includes an address in the write buffer corresponding to an address in the second memory area at which the not-yet written data is to be stored.

15. The control method according to claim 14, wherein
in the second information, for multiple pieces of data included in the data group, identification information corresponding to the error correction code is associated with address information,
wherein an address information of already written data includes an address in the first memory area, and
wherein an address information of the not-yet written data includes an address in the write buffer.

16. The control method according to claim 15, wherein
the write buffer includes a first buffer region and a second buffer region to temporarily hold information to be stored in the first buffer region,
wherein the address information of the not-yet written data includes an address in the second buffer region, and
wherein performing the error-correction decoding includes:
reading out the already written data and the not-yet written data into the second buffer region based on the second information and performing error-correction decoding thereon,
wherein the control method further comprises:
storing data after error-correction decoding into the first buffer region, adding other data to adjust data size, and writing data after the adjustment into the first memory area.

17. The control method according to claim 11, wherein the nonvolatile memory has a plurality of the first memory areas,
wherein generating the second piece of information includes:
when executing a multi-write process of, sequentially for the plurality of first memory areas, writing into multiple regions in the first memory area via multiple channels in parallel, generating a third information indicating a write status of the first memory area according to the first information; and
generating the second information according to the first information and the third information.

18. The control method according to claim 17, wherein
in the third information, for multiple data locations, a data location in the first memory area is associated with a data write status.

19. The control method according to claim 17, wherein
in the write status, information indicating a location in the first memory area where data are to be written is associated with information indicating whether or not data are written.

20. The control method according to claim 17, wherein
in the write status, information identifying a channel, information distinguishing the first memory area from the other first memory areas, information indicating a location to write data in the first memory area, and information indicating whether or not data are written are associated with each other.

* * * * *